United States Patent [19]

Renger

[11] Patent Number: 5,764,052
[45] Date of Patent: Jun. 9, 1998

[54] COIL RETURN ENERGY MEASUREMENT MAGNETIC FIELD SENSOR AND METHOD THEREOF

[75] Inventor: Herman Lee Renger, Calabasas, Calif.

[73] Assignee: Pacesetter, Inc., Sylmar, Calif.

[21] Appl. No.: 491,561

[22] Filed: Jun. 16, 1995

[51] Int. Cl.⁶ .................... G01R 27/26; G01R 33/02; G01R 33/04; G01C 7/30
[52] U.S. Cl. .................... 324/258; 324/253; 324/654
[58] Field of Search .................... 324/253, 254, 324/255, 256, 257, 258, 260, 234, 236, 654, 655

[56] References Cited

U.S. PATENT DOCUMENTS

| | | | |
|---|---|---|---|
| 4,611,127 | 9/1986 | Ibrahim et al. | 324/236 |
| 4,649,341 | 3/1987 | Ulbrich et al. | 324/654 |
| 4,994,738 | 2/1991 | Soyck et al. | 324/207.13 |
| 5,014,006 | 5/1991 | Seitz | 324/253 |
| 5,432,445 | 7/1995 | Dinsmore et al. | 324/253 |

*Primary Examiner*—Walter E. Snow

[57] ABSTRACT

A magnetic field sensor comprises a substantially planar core member having flux concentrating fins, and relatively narrow segments that interconnect the fins so that an external magnetic field becomes concentrated within the segments. A quality factor (Q) of a single coil which is wrapped around the segments is monitored to measure or detect the presence of an external magnetic field. To measure an external field, a current is passed through the coil to charge the coil with a known quantity of energy. A circuit of the sensor then measures the quantity of energy returned by the coil to measure the Q of the coil, and to thereby measure the external magnetic field. The magnetic sensor is suitable for pacemaker applications as a substitute for reed switches.

23 Claims, 4 Drawing Sheets

—— NO EXTERNAL FIELD PRESENT
- - - EXTERNAL FIELD PRESENT

// 1

COIL RETURN ENERGY MEASUREMENT MAGNETIC FIELD SENSOR AND METHOD THEREOF

FIELD OF THE INVENTION

The present invention relates to devices for measuring magnetic fields. More particularly, the present invention relates to a low-power magnetic field sensor that is suitable for pacemaker applications.

BACKGROUND OF THE INVENTION

Cardiac pacing involves the electrical stimulation of the heart in order to control the timing of the contractions of the heart. Electrical stimuli in the form of pulses are generated by a battery-powered pacemaker and applied to the tissue of the heart by one or more electrodes of a pacing lead. Implantation of the lead is typically performed by inserting the distal end of the lead into the patient's cephalic vein (one of the main veins from the upper arm), and forwarding the distal end through the subclavian vein and superior vena cava into the right side of the heart. Once the lead is properly positioned (using fluoroscopy to view the distal end of the lead), the proximal end of the lead is connected to the pacemaker and the pacemaker is implanted beneath the skin. Once the pacemaker battery becomes too weak for the pacemaker to function properly, the implanted pacemaker must be removed from the patient and replaced with a pacemaker that has a fresh battery.

Pacemakers commonly have a built-in reed switch to allow the patient (or physician) to periodically test the pacemaker battery. To test the battery, the patient's pulse rate is measured while holding a magnet to the patient's chest at a predetermined orientation. The external magnetic field of the magnet causes two closely-spaced ferromagnetic reeds of the reed switch to come together, closing the switch. While the switch is closed, the pacemaker paces the heart (assuming the battery is not dead) at a predetermined rate. If the patient's pulse during the test is different from the predetermined pacing rate, it is determined that the battery is dead, or that the pacemaker is otherwise not functioning properly.

Although the above-described test is widely accepted in the pacemaker industry, existing reed switch designs suffer from a number of problems that decrease the reliability of the test. For example, since reed switches only sense magnetic fields in a single direction, the magnet must be placed to the patient's chest with the proper pole-to-pole orientation relative to the implanted reed switch for the test to work. Further, since the two reeds of the reed switch are mounted in very close proximity, slight rotation of one of the reeds can cause the reed switch to permanently short out. Further, since the reeds are typically mounted within an evacuated glass envelope of the reed switch, a danger exists that the envelope (or the glass-metal seal) will break while inside the patient.

A need thus exists in the art for a magnetic field detector that overcomes the various deficiencies of reed switches.

SUMMARY OF THE INVENTION

The present invention comprises a magnetic field sensor that measures an external magnetic field by sensing a change in the quality factor or "Q" of a coil caused by the external field, wherein the Q of the coil is defined as Q=(energy returned by coil)/(energy put into coil) over one charging/ discharging cycle. The sensor is well suited for use within a pacemaker to enable a patient to activate a pacemaker battery test, and may be used as a substitute for pacemaker reed switches.

In a preferred embodiment, the coil is wrapped around four segments of a substantially planar, symmetrical core member that concentrates the external magnetic field within the windings of the coil. The four segments of the core member are connected to one another to form a closed loop path, so that a circulating internal magnetic field is generated within the segments when a current is passed through the coil. Each segment is further connected between a pair of fins of the core member. The width of the fins is large in comparison to the width of the segments, so that the external magnetic field attracted by the fins becomes concentrated within the segments as it extends from fin-to-fin of the core member. The core member is preferably composed of a square loop material that produces a significant change in the Q of the coil in response to an external magnetic field. The core member and coil can conveniently be formed on a multi-layer printed circuit board, with coil windings formed as traces on outer circuit board layers, and with the core member formed on an intermediate circuit board layer that is sandwiched between the outer layers.

The sensor further comprises circuitry for charging the coil, and circuitry for measuring the quantity of energy returned by the coil after the coil has been charged. In an external field measurement cycle, a current is passed through the coil to charge the coil with a predetermined quantity of energy. This charging current produces a circulating field through the segments. Once the coil has been fully charged, the amount of energy returned by the coil is measured by allowing the coil to discharge (i.e., maintain the flow of current) into a capacitor and then measuring the final voltage across the capacitor. The amount of energy returned, and thus the Q of the coil, is proportional to the intensity of the external field over a range of field intensities. The sensor can thus be used as a general purpose magnetic field measurement device.

In pacemaker applications, the sensor is used with a permanent magnet that saturates the segments of the core member when placed to the coil (i.e., when placed proximate to the patient's chest). In operation, the pacemaker periodically tests for the presence of the magnet by performing a magnetic field measurement cycle, with each cycle using only about 2 nano-joules of energy of the pacemaker's battery.

Advantageously, the sensor does not require the use of an evacuated glass envelope, and does not use closely-spaced reeds that are susceptible to shorting out. Further, the sensor does not require the patient to position the magnet with a specific linear orientation.

BRIEF DESCRIPTION OF THE DRAWINGS

These and other features of the invention will now be described with reference to the drawings of certain preferred embodiments, which are intended to illustrate and not to limit the invention, and in which.

DETAILED DESCRIPTION OF THE PREFERRED EMBODIMENTS

Although the present invention is described herein in the context of pacemakers, it will be recognized that the magnetic field sensing apparatus and method are useful in a wide variety of applications that involve the detection and/or measurement of magnetic fields.

Figure 1:
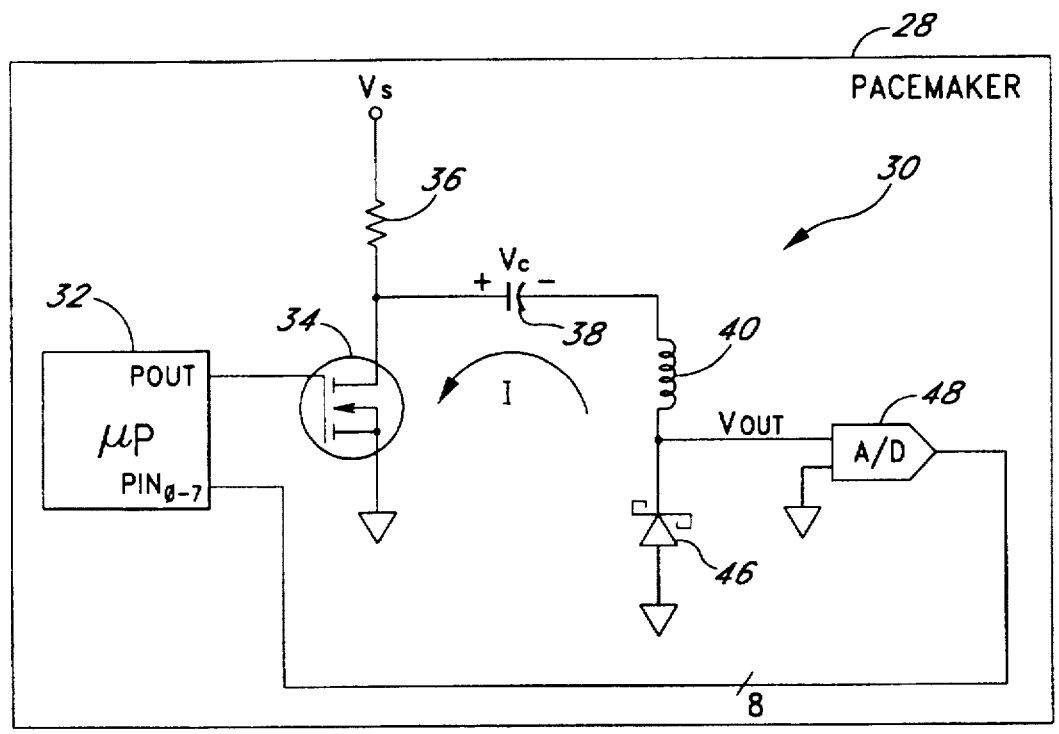
FIG. 1 is a diagram of an implantable pacemaker which includes therein a magnetic field sensor in accordance with one embodiment of the present invention.
Figure 2:
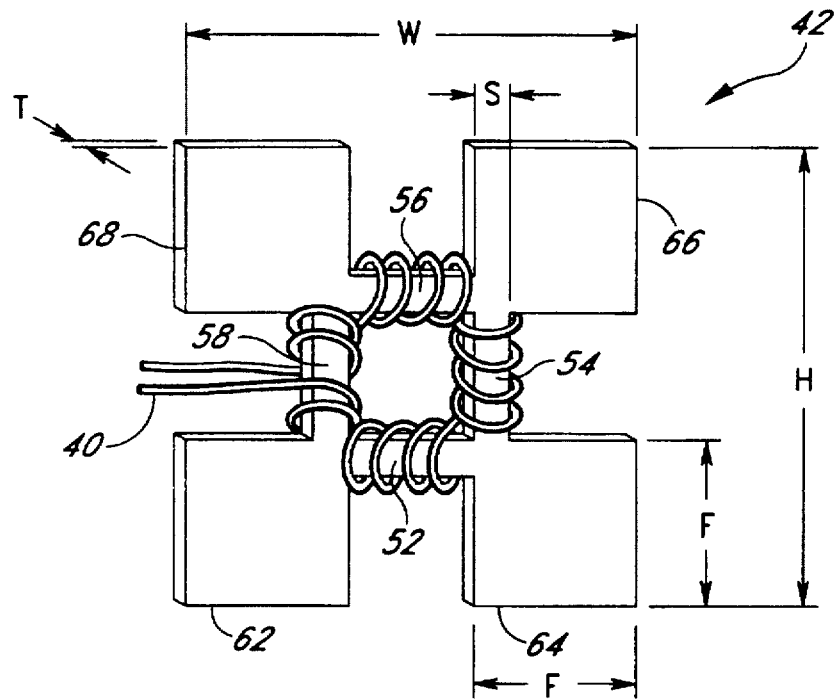
FIG. 2 is a perspective view of a flux-concentrating core member with the coil of FIG. 1 thereon.

FIGS. 1 and 2 illustrate a magnetic field sensor 30 in accordance with one embodiment of the present invention. The sensor 30 is shown in FIG. 1 within an implantable pacemaker 28, and may be used to activate a test of the pacemaker 28. The sensor 30 comprises a microprocessor 32, a switching transistor 34 (shown as an N-channel enhancement mode MOSFET), a resistor 36, a capacitor 38, a flux detection coil 40 that is wrapped on segment portions of a flux-concentrating core member 42 (FIG. 2), a Schottky diode 46, and an analog-to-digital (A/D) converter 48.

The microprocessor 32 has a single-bit output port POUT that is connected to the gate of the transistor 34, allowing the microprocessor 32 to switch the transistor 34 on and off. The source of the transistor 34 is connected to local ground. The resistor 36 is connected between the drain of the transistor 34 and a voltage source that generates a positive DC supply voltage $V_S$ (typically 3 to 5 volts). The capacitor 38 and coil 40 are connected in series to one another between the drain of the transistor 34 and the cathode of the diode 46. The anode of the diode 46 is connected to local ground. The cathode of the diode 46 is connected to the signal input of the A/D converter 48. The output of the A/D converter 48 is connected to an 8-bit input port PIN of the microprocessor 32, allowing the microprocessor 32 to periodically sample the output of the A/D converter.

For pacemaker applications, the microprocessor 32 will typically be the main microprocessor of the pacemaker 28, and the entire magnetic field sensor 30 will reside within the pacemaker housing. The microprocessor 32 may be in the form of a programmable microcontroller, an application-specific integrated circuit (ASIC), or any other type of conventional control device.

Referring to FIG. 2, the coil 40 is wrapped around four segments 52-58 of the flux-concentrating core member 42, with an approximately equal number of turns per segment. In the embodiment shown, the coil 40 has four turns per segment. The segments 52-58 are connected end-to-end to one another to form a closed loop path, so that a circulating internal magnetic field may be generated within the segments 52-58 by passing a current through the coil 40. Further, each segment is connected between a pair of fins 62-68 of the core 42.

As shown in FIG. 2, the core member 42 has a symmetrical, substantially planar configuration. For pacemaker applications, the preferred dimensions of the core member 42 are H=W=¼", F=⅒" (for each fin 62–68), S=5/100" (for each fin 62-68), and T=1/100". The core member 42 is preferably composed of a square loop core material, such as Metglas™ 2714A available from Allied Chemical, Inc. As is well known by those skilled in the art, square loop materials have a high resistance to magnetization and demagnetization. Thus, and in contrast to "soft" magnetic materials, square loop materials require the application of a relatively large magnetic field to become magnetized, and remain magnetized to a high degree when the external field is removed.

The coil 40 has a quality factor or "Q" associated with it, which is a measure of the coil's ability to return energy that is put into it by application of a DC current. In general, once a coil is charged by passing a DC current through the coil, the coil returns a portion of the energy put into it by maintaining the flow of current. For purposes of this description, the quality factor of the coil 40 may be defined as:

$$Q = \frac{\text{ENERGY RETURNED BY COIL}}{\text{ENERGY PUT INTO COIL}}$$

over one charging/discharging cycle of the coil. When a coil is connected in series with a capacitor (as in FIG. 1) to form a conventional L-C circuit, the Q of the coil is also an indication of the coil's ability to cause a resonation or "ringing" within the L-C circuit. Such ringing occurs when energy is transferred back and forth between the capacitor and the coil in a sinusoidal fashion.

The present invention is based in-part on a counter-intuitive property of coils that have magnetic cores, such as the coil 40 of FIGS. 1 and 2. When the core material of the coil becomes magnetically saturated, one would expect the coil to lose its ability to return energy put into it. Equivalently, one would expect a decrease in the Q of the coil upon reaching saturation. Through experimentation, however, it has been found that the Q of the coil increases once the core becomes saturated. It has further been found that this increase in Q is relatively large when any of a variety of square loop materials, such as Metglas™ 2714A, is used for the core. The sensor 30 of FIG. 1 makes use of this counter-intuitive effect to accurately measure an external magnetic field that passes through the core member 42. As described in detail below, during a charging cycle the sensor 30 passes a DC current through the coil 40 to charge the coil with a predetermined quantity of energy. During a discharge and measurement cycle, the sensor 30 then measures the amount of energy returned by the coil 40 to determine the Q of the coil, and to thereby determine the strength of the external magnetic field that passes through the core member 42.

Referring to FIG. 2, when a current is passed though the coil 40, the current induces an internal magnetic field through the segments 52-58 of the core member 42. Depending on the direction of the current, the internal magnetic field circulates through segments 52-58 in either the clockwise or counterclockwise direction of FIG. 2. When an external field is present that is generally aligned with the plane of the core member 42 (such as the field shown by dashed lines in FIG. 3), the internal field (induced by the current) adds to the external field in two of the segments, and subtracts from the external field in the other two segments. Once the net field on the additive side is sufficient to magnetically saturate the core material, the ability of the coil 40 to store and return energy increases, producing an increase in the Q of the coil 40. Stated differently, a relatively large portion of energy put into the coil 40 while any of the segments 52–58 is saturated is stored within the saturated core material and will be returned by the coil 40; Yet only a small portion of the energy put into the coil 40 prior to saturation will be returned. Thus, the total amount of energy returned by the coil 40 will depend upon the point at which saturation is reached (in any of the segments 52–58) during the charging cycle. Energy put into the coil prior to saturation is lost primarily due to the hysteresis losses of the core material.

For pacemaker applications and other "on/off" applications that involve the detection of a permanent magnet of a predetermined strength, a permanent magnet is preferably used that is sufficient to saturate all four of the segments 52–58 by itself, so that the segments 52–58 are pre-saturated when the coil 40 is charged. This ensures that at least two of the segments 52–58 will remain saturated throughout the charging cycle, and thus that a large portion of the energy put into the coil 40 during the charging cycle will be returned. For the coil 40 and core member 42 shown in FIG. 2 and described herein, a ¾"×¾"×2" samarium cobalt magnet that produces a target field intensity of 5 gauss in the vicinity of the coil 40 is sufficient for this purpose.

Figure 3:
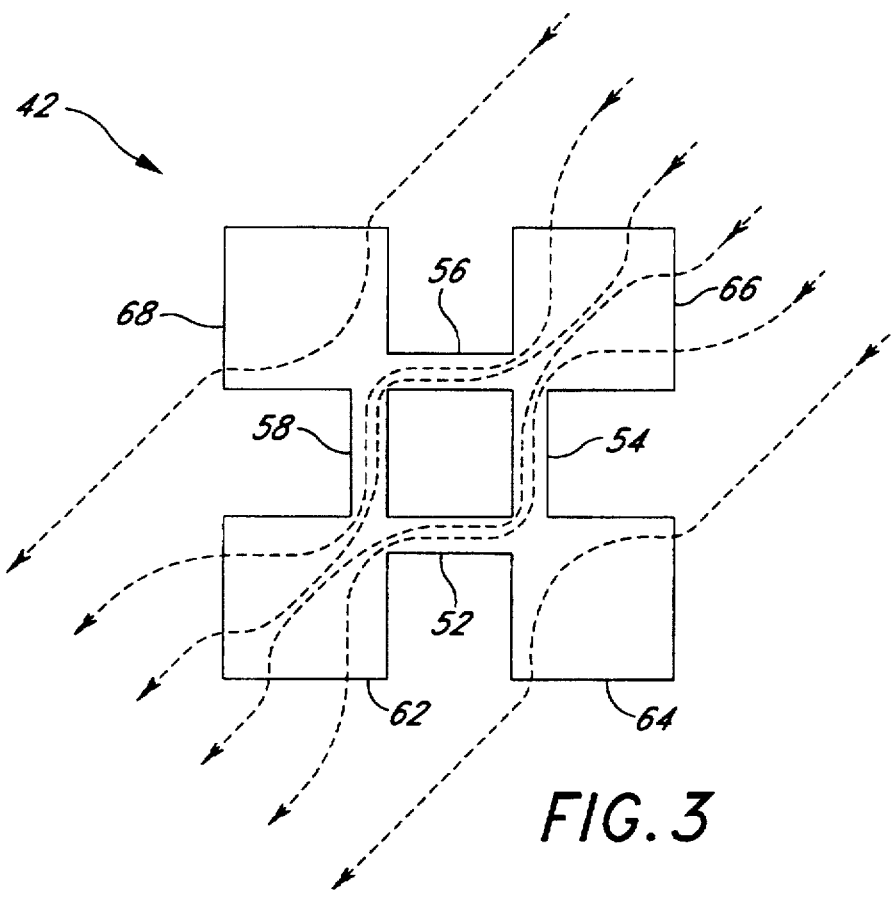
FIG. 3 is a top plan view of the flux-concentrating core member of FIG. 2, with dashed lines showing flux lines of an external magnetic field that extends through the core member.

Referring to FIG. 3, since the permeability of the core member 42 is considerably higher than the permeability of the surrounding air, the magnetic flux lines of the external magnetic field have a tendency to pass through the core member 42. The fins 62–68 thus serve to "capture" a large portion of the surrounding magnetic field. It will be recognized that the fins 62–68 also cause the deflection of the magnetic flux lines in the Z direction (assuming the core member 42 is positioned within an X-Y plane in FIG. 3), and thus attract magnetic flux lines falling above and below the core member 42. As illustrated in FIG. 3, the configuration of the core member 42 causes the magnetic field to become concentrated within the segments 52–58, with the magnetic flux density within each segment 52–58 being relatively high compared to the magnetic flux density within each fin 62–68. In the example shown in FIG. 3, the flux lines that enter the fin 66 become more closely spaced as they pass through the segments 52–58, and then spread out as they pass through the fin 62 and exit from the core member 42. The concentration of the flux lines within the segments 52–58 lowers the external field threshold needed to saturate the segments 52–58, and generally magnifies the effect of the external field on the Q of the coil 40. As will be recognized by those skilled in the art, various alternative configurations of the core member 42 are possible for achieving a similar concentration effect. For example, greater or lesser numbers of fins can be used, and the fins and/or segments may be curved or rounded.

The degree to which the core member 42 concentrates the external magnetic field within the segments 52–58 depends upon the extent to which the external magnetic field is aligned with the plane of the core member 42. No concentration will occur, for example, of an external magnetic field that is perpendicular to the plane of the core member 42. For the core member configuration shown, the sensor 30 will thus have a greater sensitivity to magnetic fields that generally fall within the plane of the core member 42. As used herein to describe the preferred embodiments, it should be understood that "external magnetic field" refers generally to fields which are oriented so as to extend within the core member 42 from one fin to another fin, and which are thus susceptible to concentration within the segments 52–58.

Figure 4:
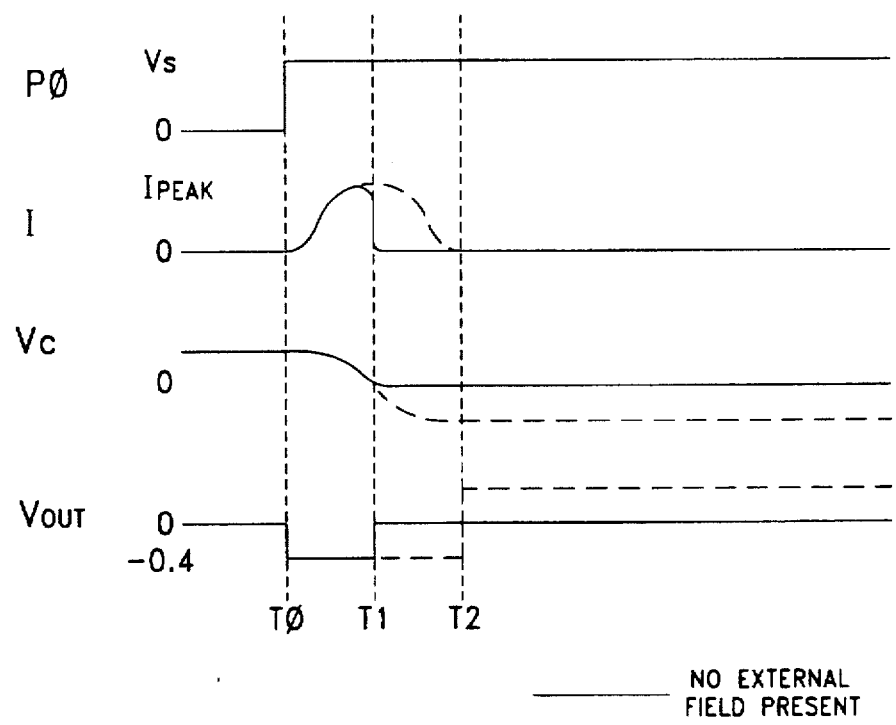
FIG. 4 is a timing diagram for the magnetic field sensor of FIG. 1, illustrating a typical magnetic field measurement cycle with no appreciable external field present (solid lines), and also illustrating a typical magnetic field measurement cycle with an external field present that saturates the segments of the core member (dashed lines)

A typical magnetic field measurement cycle for the sensor 30 of FIG. 1 will now be described with reference to FIG. 4. Initially, the output port POUT of the microprocessor 32 is held at a low state, maintaining the transistor 34 in a non-conductive or "off" state. Assuming the transistor 34 has been off for a sufficient time, the capacitor 38 will be charged to the supply voltage $V_S$ (thus storing a predetermined quantity of energy), and the current (I) will be zero. In order to take a measurement of the external magnetic field, the microprocessor 32 outputs a logic high value (at T0) to turn on the transistor 34. This causes the capacitor 38 to discharge through the transistor 34, inducing a current through the diode 46 and the coil 40. As shown in FIG. 4, the current increases from zero to its peak value $I_{PEAK}$ sinusoidally (i.e., over one quarter cycle of a sine wave), as is typical of L-C circuits. Similarly, the voltage $V_C$ across the capacitor 38 decreases from $V_S$ to zero sinusoidally. Thus, the L-C circuit initially resonates or "rings" for one quarter of a cycle as energy is transferred from the capacitor 38 to the coil 40 (and core member 42). As current flows through the circuit, a forward-bias voltage drop of about 0.4 volts appears across the diode 46, maintaining the output voltage $V_{OUT}$ at about –0.4 volts.

At T1, the capacitor 38 is fully discharged, and the current through the coil 40 is at its maximum of $I_{PEAK}$. The energy that was stored by the capacitor 38 at T0 is thus transferred to the coil 40 at T1 (neglecting the energy that is dissipated by the diode 46). Preferably, component values are used such that the circulating internal field produced by $I_{PEAK}$ saturates or nearly saturates the segments 52–58 when no external field is present.

Between T1 and T2, the coil 40 transfers a portion of the energy back to the capacitor 38, with the fraction of energy returned (or the Q) depending on the strength of the external magnetic field (if any) that passes through the core member 42. The quantity of energy returned by the coil 40 is reflected by the voltage $V_C$ across the capacitor 38 at T2, and also by the output voltage $V_{OUT}$ at T2.

Two cases are illustrated in FIG. 4: a first case wherein no appreciable external field is present (illustrated by solid-line waveforms), and a second case wherein an external magnetic field is present that pre-saturates the segments 52–58 (illustrated by dashed-line waveforms). When no external field is present, most of the energy put into the coil 40 by the capacitor 40 is lost due to hysteresis. In this situation, the current at T1 abruptly drops to zero (since the coil 40 cannot maintain the flow of current), and the capacitor 38 remains approximately at its fully-discharged state. Described differently, the hysteresis losses of the core member 42 kill or strongly attenuate the ringing of the L-C circuit, preventing the recharging of the capacitor 38. With no current flowing through the diode 46 and a voltage of approximately zero appearing across the capacitor 38, $V_{OUT}$ at T1 becomes approximately zero.

When an external field is present that pre-saturates the segments 52–58, the coil 40 acts essentially as an air-core coil, returning virtually all of the energy put into it. Equivalently, the coil 40 has a Q of approximately 1. By maintaining the flow of current, the coil 40 reverse charges the capacitor 38 to approximately $-V_S$, as illustrated in dashed lines in FIG. 4. The L-C circuit thus continues to resonate for a second quarter cycle. Once the current falls to zero (at T2), the diode 46 prevents the capacitor 38 from discharging, and thereby maintains the output voltage $V_{OUT}$ at approximately $V_S$.

For external magnetic fields falling in between the two cases illustrated in FIG. 4, the quantity of energy returned by the coil 40 will depend upon the point during the charging cycle at which saturation is reached (in any of the segments 52–58), and will thus depend upon the intensity of the external field. Since larger external fields will cause the saturation point to be reached more rapidly, the quantity of energy returned by the coil 40 will be proportional to the intensity of the external magnetic field. The output voltage $V_{OUT}$ at T2 will therefore be proportional to the magnitude of the external magnetic field. This proportional relationship between $V_{OUT}$ and the external field intensity exists over a range of external field strengths, allowing the sensor 30 to be used as a general purpose magnetic field measurement device.

Figure 5:
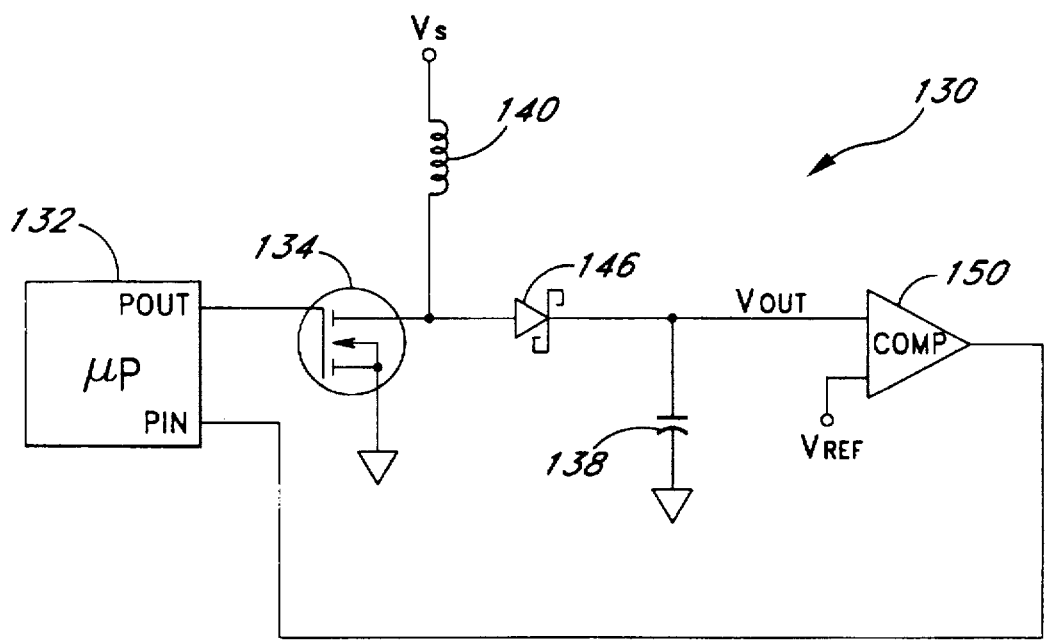
FIG. 5 is a circuit diagram of a magnetic field sensor according to a second embodiment of the present invention.

Following T2, the microprocessor 32 performs a read operation, to read the output of the A/D converter 48 and to thereby obtain a numerical representation of the detected external magnetic field. In pacemaker applications, the microprocessor 32 would compare the read-in value with a threshold value, to determine whether the measured field is of sufficient strength to place (or maintain) the pacemaker 28 in test mode. Alternatively, a comparator could be used (as shown in FIG. 5) to compare $V_{OUT}$ to a threshold voltage, and the microprocessor 32 could read the output of the comparator. Once $V_{OUT}$ has been measured (using either the A/D converter 48 or a comparator), the microprocessor 32 switches the port POUT back to a low voltage level, turning off the transistor 34 and allowing the capacitor 38 to recharge (through the resistor 36). In pacemaker applications, the microprocessor 32 would repeat the magnetic field sensing cycle periodically (e.g., every 5 seconds) to detect the placement or removal of a magnet from the patient's chest.

As noted above, the magnetic flux sensor 32 has a greater sensitivity to magnetic fields that fall generally within the plane of the core member 42. For pacemaker applications, a permanent magnet is preferably used that triggers the pacemaker's battery-test mode when placed proximate to the core member 42 in alignment with the core member 42. This enables the patient to initiate a battery test without having to position the magnet with a specific linear orientation relative to the sensor. The present invention thus simplifies the battery test over reed switch designs that require a specific pole-to-pole orientation of the magnet to trigger the battery test.

Referring to FIG. 1, the existence of an appreciable external magnetic field will cause a decrease in the inductance of the coil 40, and will thus cause a change in the resonant frequency of L-C circuit. Others in the art have attempted to detect the presence of an external magnetic field by measuring a change in coil inductance or a change in the resonant frequency of an L-C circuit. The circuit of FIG. 1, however, measures only the portion of energy returned by the coil 40, and does not measure or rely on any change in the resonant frequency of the L-C circuit or change in the inductance of the coil 40. Advantageously, the circuit of FIG. 1 requires fewer components than would be required to measure a change in inductance or resonant frequency. Further, the circuit of FIG. 1 uses very low power (approximately 2 nano-joules per measurement cycle), and is thus well suited for pacemaker and other medical applications in which it is desirable to maximize the life of an implanted battery. Further, unlike many coil-based prior art designs, the sensor 30 requires only a single coil.

Referring to FIGS. 1 and 2, the capacitor 38 is preferably large enough to generate a current that saturates the segments 52–58 when no external magnetic field is present. Since the segments 52–58 will remain magnetized after each magnetic field sensing cycle, the quantity of energy needed to saturate the segments 52–58 will be somewhat lower for sensing cycles after the first sensing cycle, and a capacitor that is merely sufficient to re-saturate the segments 52–58 can be used. For the coil 40 and core member 42 shown in FIG. 2, a capacitor 38 of about 270 picofarads is suitable.

Because of its size, the capacitor 38 is not well suited for integration within an integrated circuit (IC). Since the size of the capacitor 38 is limited by the need to re-saturate the segments 52–58 with each measurement cycle, a sensor that is better suited for partial (or full) integration can be obtained by using an integratable current controlling device to charge the coil. FIG. 5 illustrates such a sensor 130, which uses an integratable switching transistor 134 having a fixed channel resistance to control the charging current through the coil. The capacitor 138 is used only to store the energy returned by the coil 140, and is thus smaller (typically 5 to 20 pico farads) than the capacitor 38 of FIG. 1, and better suited for integration within an IC.

Referring to FIG. 5, the sensor 130 uses a coil 140 and diode 146 that are preferably identical to the coil 40 (including core member 42) and diode 46 of the sensor 30. The transistor 134 (shown as an N-channel enhancement mode MOSFET) has a fixed channel resistance of, for example, 10 ohms. The gate of the transistor 134 is connected to a single-bit output port POUT of a microprocessor 132. The coil 140 is connected between a voltage source $V_S$ and the drain of the transistor 134. The diode 146 has its anode connected to the drain of the transistor 134, and has its cathode connected to one terminal of the capacitor 138. The opposite terminal of the capacitor 138 is connected to local ground. The source of the transistor 134 is also connected to local ground. The node connecting the diode 146 to the capacitor 138 is connected to one signal input of a comparator 150. The other signal input of the comparator 150 is connected to a DC voltage reference $V_{REF}$ that corresponds to a predetermined external field intensity. The output of the comparator 150 is connected to a single-bit input port PIN of the microprocessor 132.

In operation, the microprocessor 132 normally maintains the output port POUT low, so that the transistor 134 is in a non-conductive state with no essentially current flowing between the drain and the source. To measure the external magnetic field, the microprocessor 132 generates a pulse on the output port POUT to turn the on the transistor 134 for a fixed period of time (e.g., 1 μs). While the transistor 134 is on, a charging current flows through the coil 140 and the transistor 134. Since the channel resistance of the transistor 134 is fixed, the peak current through the coil 140 is limited to a known value, and the coil 140 is charged with known quantity of energy. When the microprocessor 132 turns the transistor 134 off, the coil 140 discharges into the capacitor 138, charging the capacitor 138 to a voltage $V_{OUT}$. Since the quantity of energy returned by the coil 140 depends upon the strength of the magnetic field (if any) that passes through the core member 42 (FIG. 2) in a planar direction, the final voltage appearing across the capacitor 138 indicates the strength of the external magnetic field. The diode 146 prevents the capacitor 138 from discharging. Any conventional discharging means (not shown) can be used to discharge the capacitor 138 between samples. After waiting long enough for the current through the coil 240 to decrease to zero, the microprocessor 132 reads the output of the comparator 150. If the external magnetic field exceeds the predetermined external field threshold represented by $V_{REF}$, $V_{OUT}$ will exceed $V_{REF}$, and the comparator 150 will output a logic high value. If the external magnetic field does not exceed the predetermined threshold, $V_{OUT}$ will not exceed $V_{REF}$, and the comparator 150 will output a logic low level.

Figure 6:
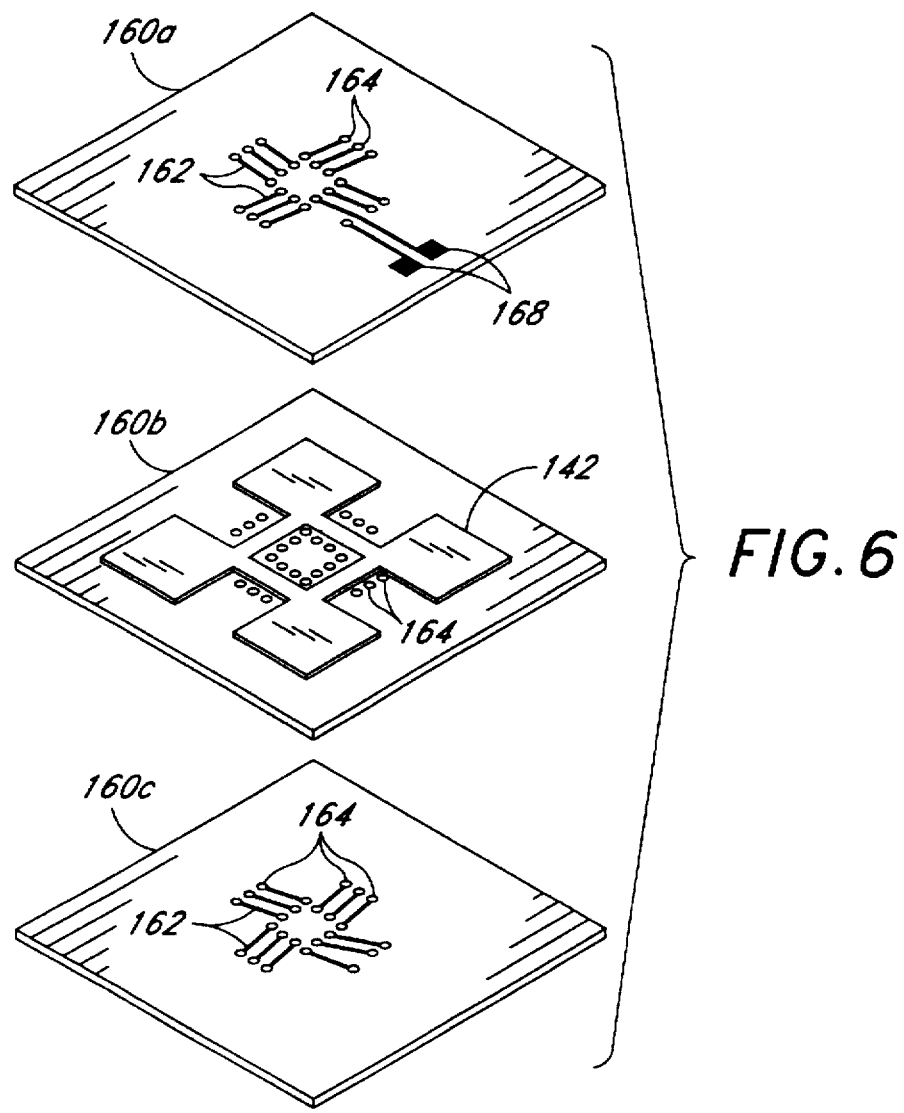
FIG. 6 is an exploded perspective view of a multi-layer printed circuit board, with a flux concentrating core member formed on an intermediate layer thereof.
Figure 7:
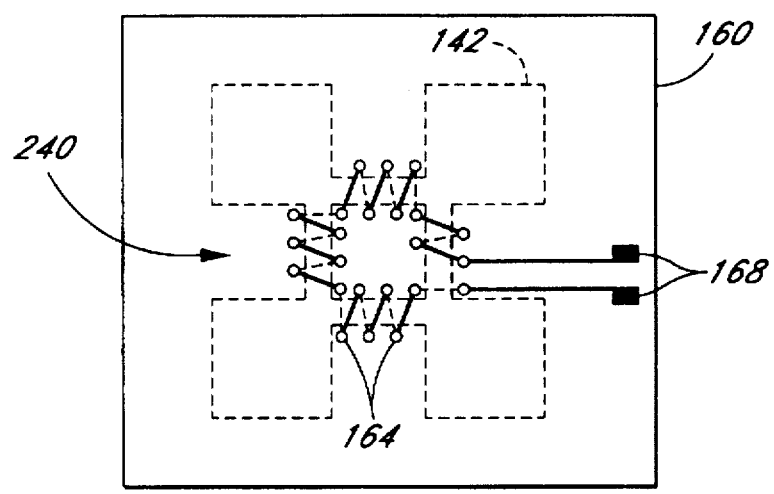
FIG. 7 is a plan view of the printed circuit board of FIG. 6.

FIGS. 6 and 7 illustrate how the flux-concentrating core member and coil may be formed on a multi-layer printed circuit board 160. The multi-layer printed circuit board 160 comprises outer layers 160a and 160c, and an intermediate layer 160b. The core member 142 is etched on the intermediate layer 160b. Conductive traces 162 are formed on the top surfaces of the outer layers 160a and 160c, with the traces extending between pairs of plated through-holes or "vias" 164. The vias 164 extend through the printed circuit board 160, and conductively interconnect the traces 162 on the outer layers 160a and 160c to form the windings of the coil 240. Conductive pads 168 are provided on the top surface of the outer layer 160a, permitting connection of the coil 240 to quality factor measurement circuitry (such as the circuitry shown in FIGS. 1 and 5).

Although this invention has been described in terms of certain preferred embodiments, other embodiments that are apparent to those or ordinary skill in the art are also within the scope of this invention. Accordingly, the scope of the present invention is intended to be defined only by reference to the appended claims.

What is claimed is:

1. A magnetic field sensor for detecting the presence of a magnetic field exceeding a predetermined threshold strength, comprising:

a core member formed of a material selected to be magnetically saturated in the presence of a magnetic field exceeding the threshold strength;

a coil which forms plural turns on said core member, said coil having a quality factor (Q), representative of a ratio of energy returned from said coil to energy put into said coil, that depends upon whether said core member is magnetically saturated;

a coil energizing circuit which energizes said coil by applying an amount of DC current to said coil;

an energy measurement circuit which measures a quantity of energy returned by said coil after said coil has been energized by said coil energizing circuit; and an evaluation circuit which determines whether said core member is in the presence of a magnetic field exceeding said threshold strength based upon the quantity of energy returned by said coil.

2. A magnetic field sensor, as defined in claim 1, wherein said coil extends around a plurality of segments of said core member, said segments connected to one another to form a closed loop path so that a circulating internal magnetic field is generated when a current is passed through said coil.

3. A magnetic field sensor, as defined in claim 1, wherein said core member comprises a plurality of fins, and each segment of said core member extends between a pair of said fins.

4. A magnetic field sensor, as defined in claim 3, wherein a width of said fins is greater than a width of said segments so that an external magnetic field that passes from fin-to-fin within said core member becomes concentrated within said segments.

5. A magnetic field sensor, as defined in claim 1, wherein said core member comprises a substantially square loop material, and wherein the Q of said coil becomes substantially equal to 1 when an external magnetic field exceeding the threshold strength is applied to said core member.

6. A magnetic field sensor, as defined in claim 1, wherein said core member is substantially planar, and wherein said magnetic field sensor senses magnetic fields that fall generally within a plane that corresponds to an orientation of said core member.

7. A magnetic field sensor, as defined in claim 6, wherein said core member is provided on a layer of a multi-layer printed circuit board.

8. A magnetic field sensor, as defined in claim 1, wherein said measurement circuit comprises a capacitor which charges in response to a current produced by said coil once said coil has been energized, a voltage across said capacitor indicating said quantity of energy returned by said coil.

9. A magnetic field sensor, as defined in claim 8, wherein said measurement circuit further comprises a current limiting circuit for preventing said capacitor from discharging once said capacitor becomes charged said from current produced by said coil.

10. A magnetic field sensor, as defined in claim 8, wherein said evaluation circuit is a voltage comparator comparing the voltage across said capacitor with a reference voltage representative of the voltage expected across the capacitor when said core material is in the presence of a magnetic field of threshold strength.

11. A method for detecting the presence of a magnetic field exceeding a predetermined threshold strength, comprising the steps of:

(a) positioning a core member, formed of a material selected to be magnetically saturated in the presence of a magnetic field exceeding the threshold strength, so that said external magnetic field passes through said core member;

(b) applying an amount of DC current to a coil which forms a conductive path around at least a portion of said core member, said coil having a quality factor (Q), representative of a ratio of energy returned from said coil to energy put into said coil, that depends upon whether said core member is magnetically saturated;

(c) measuring a quantity of energy returned by said coil after said current has been applied to said coil in step (b); and (d) utilizing said quantity of energy returned to determine whether said external magnetic field that passes through said core member exceeds said threshold strength.

12. The method according to claim 11, wherein step (b) comprises energizing said coil with a predetermined quantity of energy.

13. The method according to claim 11, wherein said core member comprises a substantially square loop material.

14. The method according to claim 11, wherein step (d) comprises comparing said quantity of energy to a predetermined threshold.

15. The method according to claim 11, further comprising the step of positioning a permanent magnet proximate to said core member to generate said external magnetic field.

16. The method according to claim 15, wherein said core member is substantially planar, and wherein said step of positioning comprises positioning said magnet such that said external magnetic field falls substantially within a plane of said core member.

17. A magnetic field sensor for detecting the presence of a magnetic field exceeding a predetermined threshold strength, comprising:

a core member formed of a material selected to be magnetically saturated in the presence of a magnetic field exceeding the threshold strength;

a coil which forms plural turns on said core member, said coil having a quality factor (Q), representative of a ratio of energy returned from said coil to energy put into said coil, that depends upon whether said core member is magnetically saturated;

a coil energizing circuit which energizes said coil by applying a predetermined quantity of energy to said coil;

an energy measurement circuit which measures a quantity of energy returned by said coil after said coil has been energized by said coil energizing circuit; and an evaluation circuit which determines whether said core member is in the presence of a magnetic field exceeding said threshold strength based upon the quantity of energy returned by said coil as compared to the predetermined quantity of energy applied to said coil.

18. A magnetic field sensor for detecting the presence of a magnetic field exceeding a predetermined threshold strength, comprising:

a core member formed of a material selected to be magnetically saturated in the presence of a magnetic field exceeding the threshold strength;

a coil which forms plural turns on said core member, said coil having a quality factor (Q), representative of a ratio of energy returned from said coil to energy put into said coil, that depends upon whether said core member is magnetically saturated;

a coil energizing circuit which energizes said coil by applying an amount of current to said coil;

an energy measurement circuit which measures a quantity of energy returned by said coil after said coil has been energized by said coil energizing circuit; and an evaluation circuit which determines whether said core member is in the presence of a magnetic field exceeding said threshold strength based upon the quantity of energy returned by said coil;

wherein said measurement circuit comprises a capacitor which charges in response to a current produced by said coil once said coil has been energized, a voltage across said capacitor indicating said quantity of energy returned by said coil.

19. A magnetic field sensor, as defined in claim 18, wherein said measurement circuit further comprises a current limiting circuit for preventing said capacitor from discharging once said capacitor becomes charged from said current produced by said coil.

20. A magnetic field sensor for detecting the presence of a magnetic field exceeding a predetermined threshold strength, comprising:

a core member formed of a material selected to be magnetically saturated in the presence of a magnetic field exceeding the threshold strength;

a coil which forms plural turns on said core member, said coil having a quality factor (Q), representative of a ratio of energy returned from said coil to energy put into said coil, that depends upon whether said core member is magnetically saturated;

a coil energizing circuit which energizes said coil by applying an amount of current to said coil;

an energy measurement circuit which measures a quantity of energy returned by said coil after said coil has been energized by said coil energizing circuit; and an evaluation circuit which determines whether said core member is in the presence of a magnetic field exceeding said threshold strength based upon the quantity of energy returned by said coil;

wherein said measurement circuit comprises a capacitor connected in series with said coil.

21. A magnetic field sensor for detecting the presence of a magnetic field exceeding a predetermined threshold strength, comprising:

a core member formed of a material selected to be magnetically saturated in the presence of a magnetic field exceeding the threshold strength;

a coil which forms plural turns on said core member, said coil having a quality factor (Q), representative of a ratio of energy returned from said coil to energy put into said coil, that depends upon whether said core member is magnetically saturated;

a coil energizing circuit which energizes said coil by applying a single pulse to said coil;

an energy measurement circuit which measures a quantity of energy returned by said coil after said coil has been energized by said coil energizing circuit; and an evaluation circuit which determines whether said core member is in the presence of a magnetic field exceeding said threshold strength based upon the quantity of energy returned by said coil in response to said single pulse.

22. A method for detecting the presence of a magnetic field exceeding a predetermined threshold strength, comprising the steps of:

(a) positioning a core member, formed of a material selected to be magnetically saturated in the presence of a magnetic field exceeding the threshold strength, so that said external magnetic field passes through said core member;

(b) applying a current for a period of time to a coil, the coil forming a conductive path around at least a portion of the core member, said coil having a quality factor (Q), representative of a ratio of energy returned from said coil to energy put into said coil, that depends upon whether said core member is magnetically saturated;

(c) at the end of the period of time, halting the application of the current to the coil;

(d) measuring a quantity of energy returned by the coil after the period of time; and (e) utilizing said quantity of energy returned to determine whether said external magnetic field that passes through said core member exceeds said threshold strength.

23. A magnetic field sensor for detecting the presence of a magnetic field exceeding a predetermined threshold strength, comprising:

a core member formed of a material selected to be magnetically saturated in the presence of a magnetic field exceeding the threshold strength;

a coil which forms plural turns on said core member, said coil having a quality factor (Q), representative of a ratio of energy returned from said coil to energy put into said coil, that depends upon whether said core member is magnetically saturated;

a coil energizing circuit which energizes said coil by applying an amount of DC current to said coil;

an energy measurement circuit which measures a quantity of energy returned by said coil after said coil has been energized by said coil energizing circuit; and an evaluation circuit which determines the external magnetic field strength based upon the quantity of energy returned by said coil.

* * * * *